United States Patent
Kim et al.

(10) Patent No.: US 8,884,280 B2
(45) Date of Patent: Nov. 11, 2014

(54) ORGANIC LIGHT EMITTING DIODE DISPLAY AND MANUFACTURING METHOD THEREOF

(71) Applicant: Samsung Display Co., Ltd., Yongin-si (KR)

(72) Inventors: Gee-Bum Kim, Suwon-si (KR); Won-Sang Park, Asan-si (KR); Min-Woo Kim, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 13/797,909

(22) Filed: Mar. 12, 2013

(65) Prior Publication Data

US 2014/0061605 A1  Mar. 6, 2014

(30) Foreign Application Priority Data

Sep. 4, 2012 (KR) .................. 10-2012-0097509

(51) Int. Cl.
 *H01L 51/52* (2006.01)
 *H01L 51/56* (2006.01)

(52) U.S. Cl.
 CPC ............ *H01L 51/5271* (2013.01); *H01L 51/56* (2013.01)
 USPC ................................................ 257/40; 438/31

(58) Field of Classification Search
 USPC ................................ 257/40, E51.021; 438/31
 See application file for complete search history.

(56) References Cited

U.S. PATENT DOCUMENTS

| 7,944,140 B2 * | 5/2011 | Kwak et al. .................... 313/504 |
| 2008/0129191 A1 | 6/2008 | Lee et al. |
| 2010/0053727 A1 | 3/2010 | Lee et al. |
| 2011/0079797 A1 * | 4/2011 | Sumida et al. .................. 257/88 |

FOREIGN PATENT DOCUMENTS

| KR | 10-2008-0050899 A | 6/2008 |
| KR | 10-2010-0027827 A | 3/2010 |
| KR | 10-2011-0076575 A | 7/2011 |
| KR | 10-2012-0055332 A | 5/2012 |

* cited by examiner

*Primary Examiner* — Daniel Shook
(74) *Attorney, Agent, or Firm* — Christie, Parker & Hale, LLP

(57) ABSTRACT

An organic light emitting diode display and a manufacturing method thereof, and more particularly, an organic light emitting diode display having improved light extraction efficiency by forming both a first electrode and a second electrode as reflective electrodes to guide generated light to the side of a pixel, and a manufacturing method thereof.

17 Claims, 5 Drawing Sheets

ORGANIC LIGHT EMITTING DIODE DISPLAY AND MANUFACTURING METHOD THEREOF

CROSS-REFERENCE TO RELATED APPLICATION

This application claims priority to and the benefit of Korean Patent Application No. 10-2012-0097509, filed on Sep. 4, 2012, with the Korean Intellectual Property Office, the present disclosure of which is incorporated herein in its entirety by reference.

FIELD

The following description relates to an organic light emitting diode display and a manufacturing method thereof, and more particularly, to an organic light emitting diode display having improved light extraction by forming both a first electrode and a second electrode as reflective electrodes to extract generated light to the side, and a manufacturing method thereof.

BACKGROUND

An organic light emitting diode display is a self-emission display device which has an organic light emitting diode which emits light to display an image. Unlike a liquid crystal display, since the organic light emitting diode display does not require a separate light source, it is possible to relatively reduce a thickness and a weight thereof. Further, since the organic light emitting diode display has high-grade characteristics such as low power consumption, high luminance, and a high response speed, the organic light emitting diode display has received attention as the next-generation display device for portable electronic apparatuses.

An organic light emitting diode is an element using light generated when an electron and a hole are coupled with each other to emit light and to dissipate the emitted light. Generally, the organic light emitting diode basically includes an electrode for injecting a hole, an electrode for injecting an electron, and an emission layer, and has a structure in which the emission layer is laminated between a positive electrode which is the electrode for injecting a hole and a negative electrode which is the electrode for injecting an electron. In more detail, when the electron is injected to the negative electrode of the organic light emitting diode and the hole is injected to the positive electrode, charges thereof move in opposite directions to each other by an external electric field and then are coupled with each other in the emission layer to emit light so that the light can be emitted and the emitted light may be dissipated. In the organic light emitting diode, the emission layer is made of a single molecular organic material or a polymer.

Also, the organic light emitting diode display has a multilayer laminated structure, and the light generated from the emission layer is transmitted into the one or more layers of the organic light emitting diode display and thus a ratio of light which is not discharged outside is considerably high. The phenomenon may be caused by a waveguide phenomenon due to total reflection, and it is known that light extraction efficiency in the organic light emitting diode display is considerably low at about 20%. Accordingly, in the organic light emitting diode display, it is very important to increase the light extraction efficiency.

SUMMARY

Aspects of embodiments of the present disclosure are directed toward an organic light emitting diode display capable of improving light extraction efficiency by forming a reflector on a pixel defining layer and a manufacturing method thereof.

An exemplary embodiment of the present disclosure provides an organic light emitting diode display, including: a substrate; an insulating layer disposed on the substrate; a first electrode disposed on the insulating layer; a pixel defining layer overlapped with an end portion of the first electrode and disposed between the first electrodes of different pixels of the display; an organic emission layer disposed on the first electrode; and a second electrode disposed on the organic emission layer, in which both the first electrode and the second electrode are reflective electrodes.

The organic light emitting diode display may further include a semiconductor element disposed on the substrate and electrically connected with the first electrode.

The second electrode may have an inclined portion in the substrate direction. Here, an inclined angle of the inclined portion may be 30° to 75°.

The second electrode may have a circular arc portion surrounding the end portion of the first electrode at the end portion of the first electrode. Here, an inclined angle of the circular arc portion may be 30° to 75° relative to a surface of the first electrode at a point corresponding to a contact point between the first electrode and the pixel defining layer.

The insulating layer may include a first insulating layer formed on the substrate and a second insulating layer formed on the first insulating layer, and a concave portion may be formed on the second insulating layer. Here, the concave portion may be formed in an external area of the first electrode.

Another exemplary embodiment of the present disclosure provides an organic light emitting diode display, including: a substrate; a first electrode disposed on the substrate; an organic emission layer disposed on the first electrode; and a second electrode disposed on the organic emission layer, in which both the first electrode and the second electrode are reflective electrodes, and the second electrode extends to an external area of the first electrode and has an inclination from the external area of the first electrode to the substrate direction.

Further, the present disclosure provides a manufacturing method of the organic light emitting diode display.

Yet another exemplary embodiment of the present disclosure provides a manufacturing method of an organic light emitting diode display, including: forming a first insulating layer on a substrate; forming a second insulating layer on the first insulating layer; forming a first electrode on the second insulating layer; forming a pixel defining layer between the first electrodes of different pixels of the display; forming an organic emission layer on the first electrode; and forming a second electrode on the organic emission layer.

The manufacturing method of an organic light emitting diode display may further include forming a concave portion in an area other than the area where the first electrode is disposed after forming the second insulating layer, in which the pixel defining layer is patterned throughout the end portion of the first electrode and the concave portion to be formed in an arch shape, the first electrode and the second electrode are reflective electrodes, and the second electrode is formed throughout the top of the organic emission layer and the top of the pixel defining layer.

The second electrode may have an inclined portion in the substrate direction. Here, an inclined angle of the inclined portion may be 30° to 75°.

The second electrode may have a circular arc portion surrounding the end portion of the first electrode at the end portion of the first electrode. Here, an inclined angle of the circular arc portion may be 30° to 75° relative to a surface of the first electrode at a point corresponding to a contact point between the first electrode and the pixel defining layer.

In the organic light emitting diode display according to an exemplary embodiment of the present disclosure, both a first electrode and a second electrode are formed as reflective electrodes to extract light generated inside to the side of the pixel and as a result, an amount of light lost inside is reduced, such that it is possible to improve light extraction efficiency.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
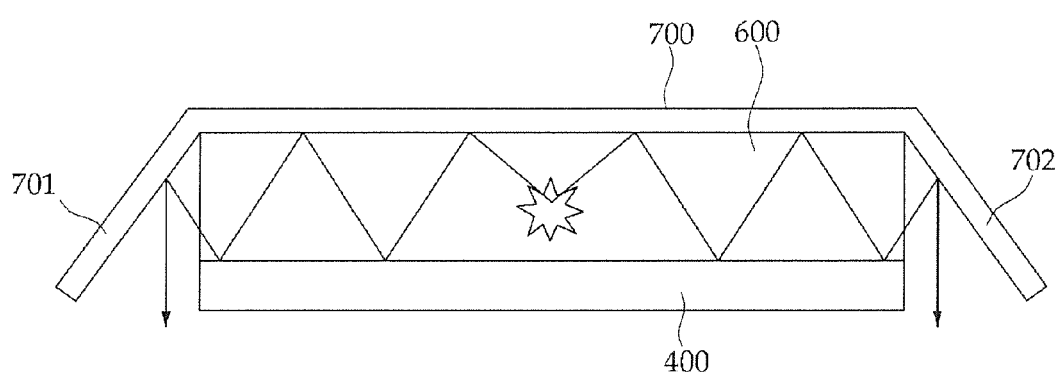
FIG. 1 is a diagram illustrating a light extraction mechanism in an organic light emitting diode display according to an exemplary embodiment of the present disclosure.

Hereinafter, exemplary embodiments of the present disclosure will be described in more detail with reference to the accompanying drawings.

Although the present disclosure can be modified variously and have several embodiments, specific exemplary embodiments are illustrated in the accompanying drawings and will be mainly described in the specification. However, the scope of the present disclosure is not limited to the specific embodiments and should be construed as including all the changes, equivalents, and substitutions included in the spirit and scope of the present disclosure.

Terms used in the present disclosure select normal terms which are widely used presently, but in some cases, a term which is arbitrarily selected by an applicant exists, and in this case, a meaning thereof should be understood by being disclosed in the description of the present disclosure or considering the used meaning.

Parts which are not associated with the description are omitted in order to specifically describe the present disclosure and like reference numerals refer to like elements throughout the specification. Further, in the drawings, size and thickness of each element are arbitrarily illustrated for convenience of description, and the present disclosure is not necessarily limited to those illustrated in the drawings.

In the drawings, the thicknesses of layers and regions are enlarged for clarity. In the drawings, the thicknesses of a layer and a region are exaggerated for convenience of description. It will be understood that when an element such as a layer, film, region, or substrate is referred to as being "on" another element, it can be directly on the other element or intervening elements may also be present.

FIG. 1 is a diagram illustrating a light extraction mechanism in an organic light emitting diode display (e.g., a pixel or pixel portion of the display) according to an exemplary embodiment of the present disclosure.

The organic light emitting diode display illustrated in FIG. 1 may be referred to as a rear emission type in which a display surface is formed on a substrate side. In this case, a first electrode 400 and a second electrode 700 are formed by reflectors so that light generated in an emission layer is reflected between the first electrode 400 and the second electrode 700 and moves to the side to be emitted to the outside by inclined portions 701 and 702.

In general, in the organic light emitting diode display, the light is generated from an organic emission layer, and only about 30% of the generated light passes through the front surface to be emitted to the outside and the remaining 70% thereof is dissipated. The dissipated light is mostly dissipated by total reflection. For example, an optical waveguide may be formed on the organic emission layer when a condition for which total reflection occurs by a difference in a refractive index between the organic emission layer and the adjacent layers is met. Most of the light generated from the organic emission layer is propagated by the optical waveguide to be dissipated as heat.

As such, in order to reduce a quantity of the dissipated light, in an embodiment of the present disclosure, the light generated from the organic emission layer 600 moves to the optical waveguide by two reflectors (that is, the first electrode and the second electrode) through the formation of the first electrode 400 and the second electrode 700 with reflectors, and as a result, the light is emitted to the outside by the inclined portions 701 and 702 positioned at the side of the pixel.

In the present disclosure, as illustrated in FIG. 1, the light generated from the organic emission layer 600 is reflected between an upper reflector as the second electrode 700 and a lower reflector as the first electrode 400, that is, between the two reflectors to move to an optical waveguide mode and then emitted to the outside by the inclined portions 701 and 702 positioned at the side of the pixel, thereby improving light emitting efficiency. That is, in the present disclosure, a path of light which is emitted to the front in the related art is changed and the light may be emitted to the side, thereby improving light emitting efficiency.

Figure 2:
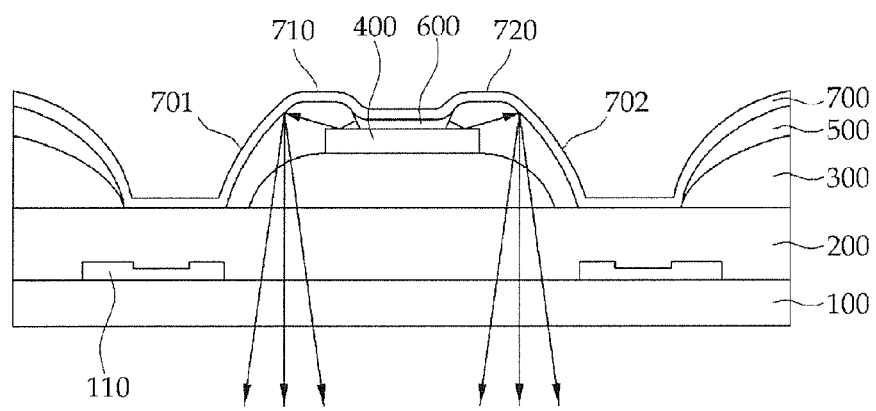
FIG. 2 is a diagram schematically illustrating a structure of the organic light emitting diode display according to the exemplary embodiment of the present disclosure.

FIG. 2 is a cross-sectional view schematically illustrating an organic light emitting diode display according to an exemplary embodiment of the present disclosure.

As illustrated in FIG. 2, an organic light emitting diode display according to an exemplary embodiment of the present disclosure basically includes a substrate 100; insulating layers 200 and 300 disposed on the substrate; a first electrode 400 disposed on the insulating layer 300; a pixel defining layer 500 overlapped with an end portion of the first electrode 400 and disposed between the first electrodes 400 of different pixels of the display; an organic emission layer 600 disposed on the first electrode 400; and a second electrode 700 disposed on the organic emission layer 600.

Referring to FIG. 2, a semiconductor element 110 may be disposed between the substrate 100 and the first insulating layer 200. An example of the semiconductor element includes a thin film transistor (TFT) including a gate electrode, a source electrode, and a drain electrode.

In FIG. 2, a case where the first electrode 400 is a positive electrode is exemplified, and the first electrode 400 as the positive electrode may be electrically connected with the drain electrode of the thin film transistor (TFT). The semiconductor element may be formed by a suitable method of forming the thin film transistor. Accordingly, the description for a detailed method of forming the semiconductor element or the thin film transistor is omitted.

As illustrated in FIG. 2, the insulating layer having an inclined portion is disposed on the substrate 100.

As the substrate 100, a transparent insulation substrate may be used. For example, the substrate 100 may be formed by a glass substrate, a quartz substrate, a transparent resin substrate, or the like. The transparent resin substrate which may be used as the substrate 100 may include a polyimide resin, an acrylic resin, a polyacrylate resin, a polycarbonate resin, a polyether resin, a polyethylene terephthalate resin, a sulfonic acid resin, or the like. These materials may be used either alone or in combination thereof.

According to the exemplary embodiment of the present disclosure, a lower structure including a switching element, a contact, a pad, a plug, an electrode, a conductive pattern, an insulation pattern, or the like may be provided on the substrate. In this case, the insulating layer may have enough thickness to cover the lower structures.

The insulating layer may be formed either as a single structure, or as a multilayer structure including two or more insulating layers.

That is, as illustrated in FIG. 2, the insulating layer may include a first insulating layer 200 and a second insulating layer 300 which are sequentially formed on the substrate 100. In this case, the first insulating layer 200 and the second insulating layer 300 may be formed by using substantially the same or similar material. In one embodiment, the first insulating layer 200 and the second insulating layer 300 are formed by using different materials.

Hereinafter, it may be understood that the insulating layer refers to both the first insulating layer 200 and the second insulating layer 300 in the case of being disclosed as the 'insulating layer' without dividing the first insulating layer 200 and the second insulating layer 300.

According to the exemplary embodiment of the present disclosure, in order to improve flatness of the insulating layer formed on the substrate, a planarization process may be performed on the substrate. For example, the substrate may have a flat upper surface by using a chemical mechanical polishing (CMP) process, an etch-back process, or the like.

According to the exemplary embodiment of the present disclosure, the insulating layer may contain an organic material. For example, the insulating layer may contain a material selected from photoresist, acrylate-based polymer, polyimide-based polymer, polyamide-based polymer, siloxane-based polymer, polymer containing a photosensitive acryl carboxyl group, a novolac resin, and an alkali developable resin. These materials may be used either alone or in combination thereof.

According to another exemplary embodiment of the present disclosure, the insulating layer 200 may be formed by using an inorganic material such as a silicon compound, metal, metal oxide, or the like. For example, the insulating layer 200 may contain a material selected from silicon oxide (SiOx), silicon nitride (SiNx), silicon oxynitride (SiOxNy), silicon oxycarbide (SiOxCy), silicon carbonitride (SiCxNy), aluminum (Al), magnesium (Mg), zinc (Zn), hafnium (Hf), zirconium (Zr), titanium (Ti), tantalum (Ta), aluminum oxide (AlOx), titanium oxide (TiOx), tantalum oxide (TaOx), magnesium oxide (MgOx), zinc oxide (ZnOx), hafnium oxide (HfOx), zirconium oxide (ZrOx), and titanium oxide (TiOx). These materials may be used either alone or in combination thereof.

The insulating layer 200 may be formed on the substrate by using a spin coating process, a printing process, a sputtering process, a chemical vapor deposition (CVD) process, an atomic layer deposition (ALD) process, a plasma enhanced chemical vapor deposition (PECVD) process, a high density plasma-chemical vapor deposition (HDP-CVD) process, a vacuum deposition process, or the like according to a constituent material.

As illustrated in FIG. 2, the insulating layer may have a concave portion at an external area of the first electrode 400. That is, the concave portion has a concaved bottom portion and an inclined portion which is a side portion having an inclination.

In more detail, in FIG. 2, the concave portion is formed by the first insulating layer 200 and the second insulating layer 300. In this case, the first insulating layer 200 forms the bottom portion, and the side portion of the second insulating layer 300 forms the inclined portion.

The first electrode 400 is formed on the second insulating layer 300 having the inclined portion. The first electrode 400 may be made of a material which is suitable for serving as a reflector. In more detail, the material may be metal which may be used as an electrode having high reflectance, and for example, the first electrode 400 may contain a metal such as aluminum, silver, platinum, gold (Au), chromium, tungsten, molybdenum, titanium, palladium (Pd), iridium (Ir), or an alloy thereof. These materials may be used either alone or in combination thereof. Further, the first electrode 400 may be formed in a single layer structure or multilayer structure containing the above metal or the alloy.

According to the exemplary embodiment of the present disclosure, the first electrode 400 may be formed on a part of the second insulating layer 300 by forming a first electrode layer on the front surface of the second insulating layer 300 and then patterning the first electrode layer. Here, the first electrode layer may be formed by a method such as a sputtering process, a vacuum deposition process, a chemical vapor deposition process, a pulse laser deposition process, a printing process, and an atomic layer deposition process using a material configuring the first electrode 400. As described below, the first electrode 400 may extend up to a part of an adjacent non-luminescent region based on a luminescent region of the organic light emitting diode display.

In other exemplary embodiments, a through-hole which is connected to the semiconductor element through the second insulating layer 300 may be formed in the second insulating layer 300. A part of the semiconductor element is exposed by the through-hole, a contact structure or a pad structure is formed in the through-hole and on the exposed semiconductor element, for example, the thin film transistor (TFT), and the first electrode 400 formed on the insulating layer may be connected to the contact structure or the pad structure. Accordingly, the first electrode 400 may be electrically connected to the semiconductor element through the contact structure or the pad structure.

Next, the pixel defining layer 500 is formed on the second insulating layer 300 and the first electrode 400. The pixel defining layer 500 may be formed by using an organic material, an inorganic material, and the like. For example, the pixel defining layer 500 may contain a material selected from an organic material such as photoresist, a polyacryl-based resin, a polyimide-based resin, and an acryl-based resin or an inorganic material such as a silicon compound.

In one embodiment, a material for forming the pixel defining layer 500 is entirely coated on the first electrode 400 and the second insulating layer 300 and then partially etched to form the pixel defining layer 500 so that a part of the first electrode 400 is exposed. For example, the first electrode 400 may be exposed by using a photolithography process or an etching process using an additional etching mask. In the exemplary embodiments, a side wall of an opening of the pixel defining layer 500 may have substantially the same or similar inclined angle as or to an inclined angle of the inclined portion of the insulating layer. For example, the side wall of the opening of the pixel defining layer 500 may have an inclined angle with respect to the first electrode 400. For example, the side wall of the opening of the pixel defining layer 500 may have an inclined angle of about 30° to about 75° in a substantially horizontal direction with respect to the first electrode 400.

Next, the organic emission layer 600 is formed on the exposed first electrode 400.

The organic emission layer 600 may be formed by using emission materials capable of generating different color lights such as red light, green light, and blue light according to each pixel of the organic light emitting diode display. According to another exemplary embodiment, the organic emission layer 600 may have a multilayer structure which emits white light by laminating a plurality of emission materials capable of implementing different color lights such as red light, green light, and blue light. According to another exemplary embodiment, the organic emission layer 600 may additionally include a host material having a substantially large band gap as compared with the emission materials.

According to the exemplary embodiment of the present disclosure, a first emission auxiliary layer may be formed between the first electrode 400 and the organic emission layer 600. In this case, the first emission auxiliary layer may include at least one of a hole injection layer and a hole transport layer. Further, a second emission auxiliary layer may be formed between the organic emission layer 600 and the second electrode 700. In this case, the second emission auxiliary layer may include at least one of an electron injection layer and an electron transport layer.

Next, the second electrode 700 is formed on the organic emission layer 600. The second electrode 700 may be formed to have a regular or suitable thickness.

The second electrode 700 may be formed by using a reflective material in order to act as a reflector, like the first electrode 400. For example, the second electrode 700 may contain a metal such as aluminum, silver, platinum, gold (Au), chromium, tungsten, molybdenum, titanium, palladium (Pd), iridium (Ir), or an alloy thereof. These materials may be used either alone or in combination thereof.

According to the exemplary embodiment of the present disclosure, the second electrode 700 may be formed all over the surface so as to cover the organic emission layer 600, the pixel defining layer 500, and the exposed insulating layer 200. According to another exemplary embodiment, the second electrode 700 may be positioned only in the luminescent region. For example, the second electrode 700 may be formed on a part of the organic emission layer 600. In this case, a second electrode layer (not shown) is formed all over the surface on the organic emission layer 600 and then patterned to form the second electrode 700 so as to be selectively disposed only in the luminescent region.

According to the exemplary embodiment of the present disclosure, the second electrode 700 acts as a reflection surface like the first electrode 400 and may have the inclined portions 701 and 702 in a substrate direction so as to emit the light which is reflected between the two reflection surfaces to move to the side and toward the outside.

According to another exemplary embodiment of the present disclosure, the second electrode 700 may have circular arc portions 710 and 720 surrounding the end portion of the first electrode at the end portion of the first electrode 400.

Figure 3:
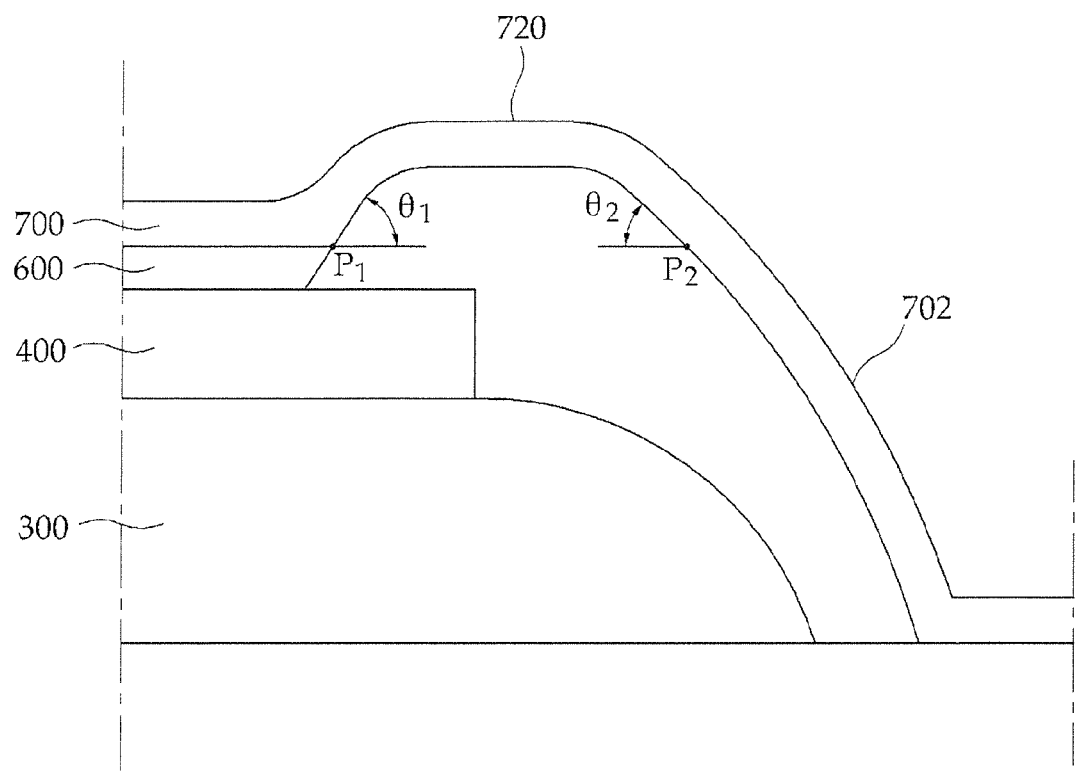
FIG. 3 is a cross-sectional view for describing a detailed structure of the organic light emitting diode display according to the exemplary embodiment of the present disclosure.

FIG. 3 is a cross-sectional view for describing a structure of a second electrode according to another exemplary embodiment of the present disclosure.

As illustrated in FIG. 3, the structure of the second electrode will be described in more detail by exemplifying a right circular arc portion 720 and the inclined portion 702 of the second electrode. It may be understood that the description for the right circular arc portion to be described below is equally applied to a left circular arc portion 710 and the inclined portion 701.

Referring to FIG. 3, the second electrode 700 may have the inclined portion 702 and the circular arc portion 720. The circular arc portion 720 is defined by a point P1 to a point P2, and a portion below the point P2 is referred to as the inclined portion 702. An inclined angle $\theta 1$ of the point P1 is referred to as an inclined angle of the circular arc portion 720, and an inclined angle $\theta 2$ of the point P2 may be referred to as an inclined angle of the inclined portion 702. In this case, $\theta 1$ which is the inclined angle of the circular arc portion and $\theta 2$ which is the inclined angle of the inclined portion may have inclined angles of about 30° to about 75° so as to emit the light which is reflected between the first electrode 400 and the second electrode 700 to move to the side and toward the outside.

Figure 4A:
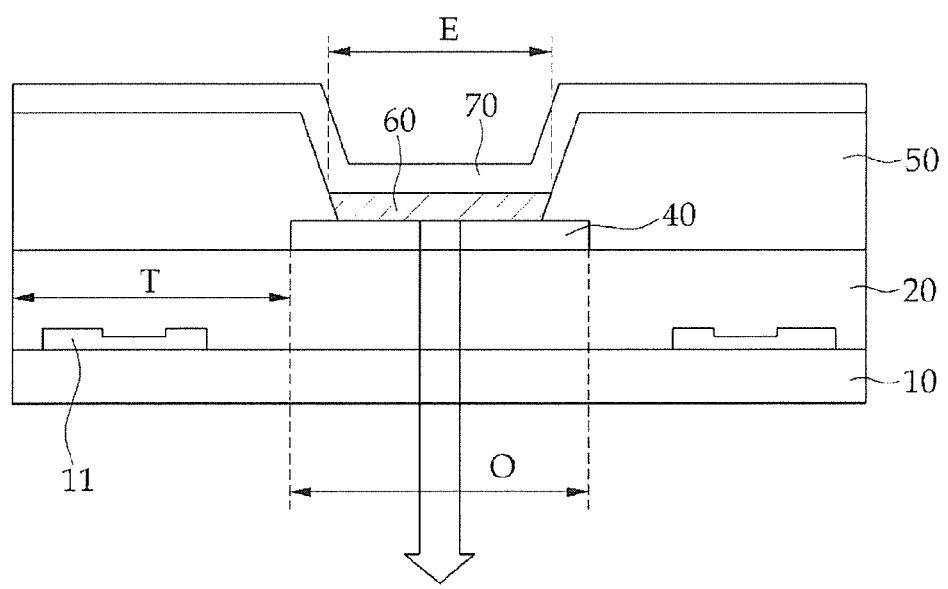
FIG. 4A is a diagram schematically illustrating a structure and a light extraction path of a general organic light emitting diode display.
Figure 4B:
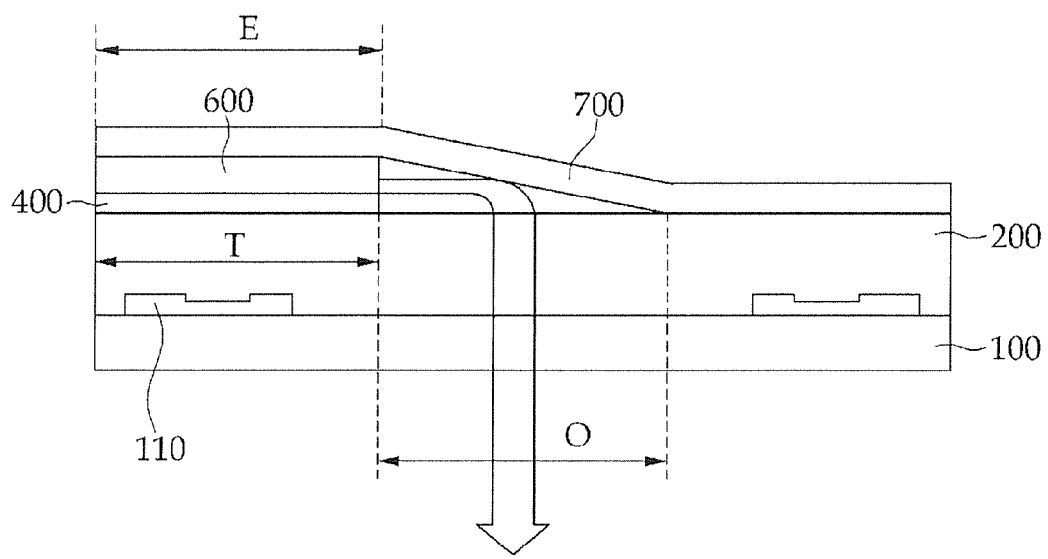
FIG. 4B is a diagram schematically illustrating a structure and a light extraction path of an organic light emitting diode display according to another exemplary embodiment of the present disclosure.

FIGS. 4A and 4B are diagrams for comparing and describing a structure and a light path of an organic light emitting diode display according to another exemplary embodiment of the present disclosure with a structure and a light path of a general organic light emitting diode display in the related art.

As illustrated in FIG. 4A, in a general rear emission type organic light emitting diode display, both an emission region E and an opening region O are disposed at the same position, and a wire, a circuit region T, and the like may not be disposed between the emission region E and the opening region O. As a result, there are many limits on a pixel design and it is difficult for a high-resolution design.

In contrast, as illustrated in FIG. 4B, in a rear emission type organic light emitting diode display according to another exemplary embodiment of the present disclosure, both the emission region E and the opening region O are disposed at different portions, and the emission region E may be disposed on the wire and the circuit region T like the front emission type. As a result, a high-resolution design is possible.

FIGS. 5A to 5F schematically illustrate an example of a manufacturing method of the organic light emitting diode display according to an exemplary embodiment of the present disclosure.

In the example illustrated in FIGS. 5A to 5F, a case of including the first insulating layer 200 and the second insulating layer 300 as the insulating layer is exemplified.

Figure 5A:
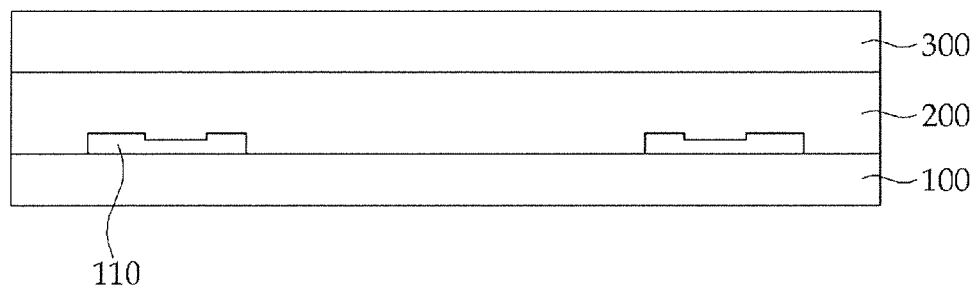
FIGS. 5A to 5F are cross-sectional views for describing a manufacturing method of the organic light emitting diode display according to an exemplary embodiment of the present disclosure.
Figure 5B:
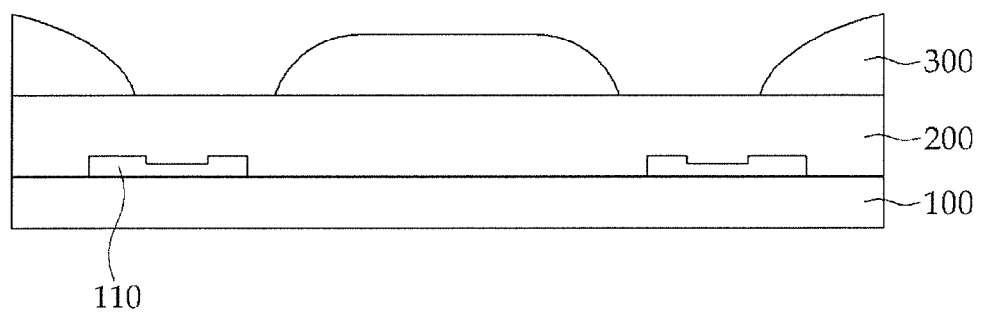

First, the first insulating layer 200 and the second insulating layer 300 having the inclined portion are formed on the substrate 100 (see FIGS. 5A and 5B).

In order to form the second insulating layer 300 having the inclined portion, the second insulating layer 300 is first formed on the entire surface of the first insulating layer 200 and then partially removed to form a plurality of concave portions having a bottom portion and an inclined portion.

As illustrated in FIG. 5B, when the second insulating layer 300 is partially removed, the second insulating layer 300 is partially removed up to a portion which is in contact with the first insulating layer 200 so that an inclination is formed at the side of the removed portion.

As such, a concave portion is formed by partially removing the second insulating layer 300, and the inclined portion is formed at the side portion of the concave portion. Here, the bottom portion of the concave portion becomes the first insulating layer 200.

Figure 5C:
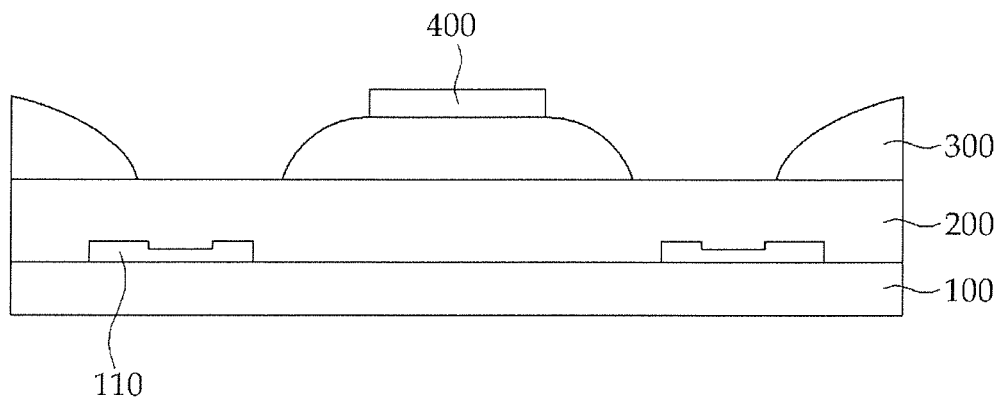

Next, the first electrode 400 is formed on the second insulating layer 300 (see FIG. 5C). The first electrode 400 may be made of metal which has high reflectance and may be used as an electrode, but the metal may include aluminum, silver, or the like as an example. Further, a thickness of the first electrode 400 may depend on the formed material, but may be controlled so that reflection is 90% or more and transmittance is 0.1%.

Figure 5D:
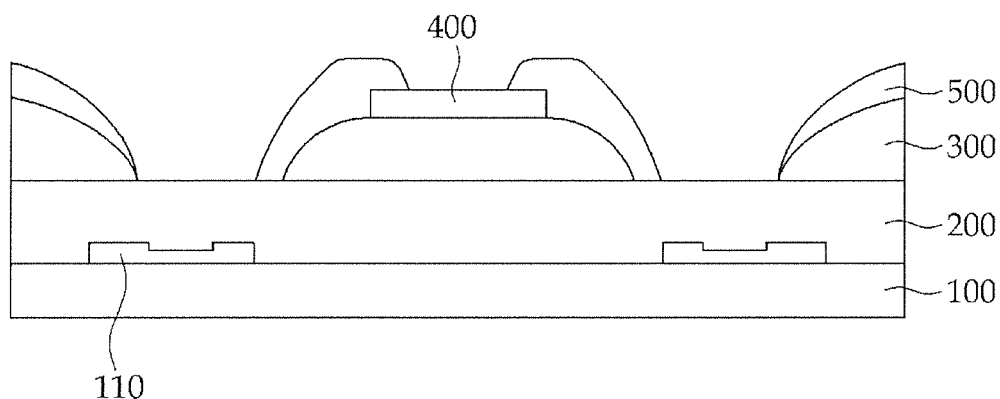

Next, the pixel defining layer 500 is formed to section the first electrode 400 by a pixel unit (see FIG. 5D). Referring to FIG. 5D, the pixel defining layer 500 is formed by extending up to the upper portion of the second insulating layer 300 and the end portion of the first electrode 400. That is, the pixel defining layer 500 is formed to cover a part of the first insulating layers 200.

A portion which is not covered by the pixel defining layer 500 is referred to as an opening region or an opening region of the first electrode 400.

Figure 5E:
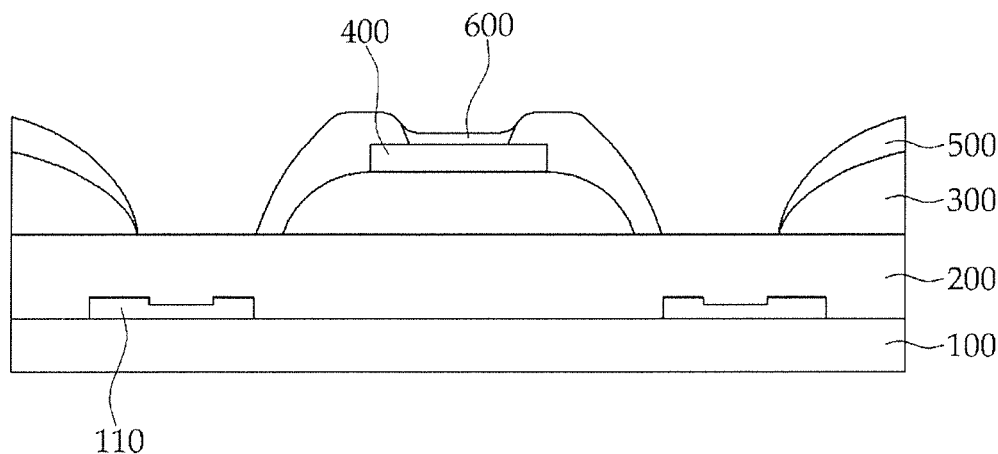

Next, the organic emission layer 600 is formed on the exposed first electrode 400 (see FIG. 5E). In this case, the organic emission layer 600 may be formed by extending up to the upper portion of the first electrode 400 and the side portion of the pixel defining layer 500.

Figure 5F:
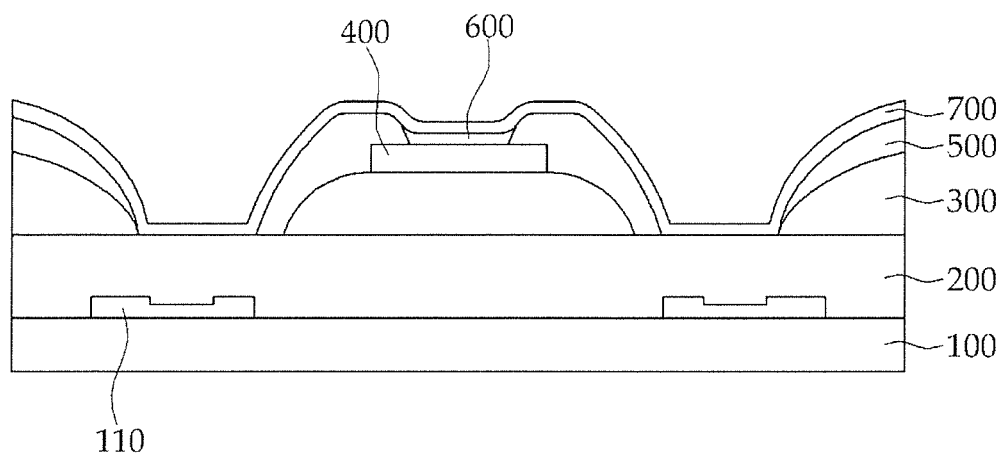

Next, the second electrode 700 is formed on the organic emission layer 600 (see FIG. 5F).

The second electrode 700 may be formed so as to have an inclined portion in the substrate 100 direction. Here, an inclined angle of the inclined portion may be 30° to 75°.

Further, the second electrode 700 may be formed to have a circular arc portion surrounding the end portion of the first electrode 400 at the end portion of the first electrode 400. In this case, an inclined angle of the circular arc portion may be 30° to 75° relative to (based on) a first electrode surface at a point corresponding to a contact point between the first electrode 400 and the pixel defining layer 500. Also, in the circular arc portion of the second electrode 700, the inclined angle may be smaller from the contact point between the first electrode 400 and the pixel defining layer 500 to a vertex of the circular arc portion.

According to the exemplary embodiment of the present disclosure, a first emission auxiliary layer may be formed between the first electrode 400 and the organic emission layer 600. In this case, the first emission auxiliary layer may include at least one of a hole injection layer and a hole transport layer. Further, a second emission auxiliary layer may be formed between the organic emission layer 600 and the second electrode 700. In this case, the second emission auxiliary layer may include at least one of an electron injection layer and an electron transport layer.

In an organic light emitting diode display including a lower electrode, an organic emission layer, and an upper electrode in the related art, light generated from the organic emission layer is totally or substantially reflected between the organic emission layer and the upper and lower electrodes, and as a result, light loss of about 20% or more occurs.

In contrast, according to the exemplary embodiment of the present disclosure, by forming the upper electrode and the lower electrode as the reflectors, light in the organic light emitting diode display is not lost due to total reflection and moves through the optical waveguide by the two reflectors to be emitted to the side of the pixel, thereby improving extraction efficiency of external light. As a result, the organic light emitting diode display according to the present disclosure may ensure increased light efficiency as compared with the organic light emitting diode display in the related art.

Further, according to the exemplary embodiment of the present disclosure, since the light induced by the optical waveguide is emitted when interference between wavelengths is completed between the upper electrode and the lower electrode, that is, the two reflectors, there is no change in a resonance distance due to a viewing angle. Accordingly, as compared with the organic light emitting diode display in the related art, it is possible to remove a color shift cause according to a change in the resonance distance.

Further, the emission portion and the opening portion are disposed at different positions, in the rear emission type organic light emitting diode display in the related art, and as such the wire and the circuit may not be positioned in the opening portion. However, according to the exemplary embodiment of the present disclosure, in the organic light emitting diode display according to the exemplary embodiment of the present disclosure, the emission portion may be disposed on the wire or the circuit, such that it is possible to implement a high-resolution structure.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims, and equivalents thereof.

What is claimed is:

1. An organic light emitting diode display, comprising:
   a substrate;
   an insulating layer on the substrate;
   a first electrode on the insulating layer;
   a pixel defining layer overlapped with an end portion of the first electrode and disposed between the first electrodes of different pixels of the display;
   an organic emission layer on the first electrode; and
   a second electrode on the organic emission layer,
   wherein both the first electrode and the second electrode are reflective electrodes, and
   wherein the second electrode has a circular arc portion surrounding the end portion of the first electrode.

2. The organic light emitting diode display of claim 1, further comprising:
   a semiconductor element on the substrate and electrically connected with the first electrode.

3. The organic light emitting diode display of claim 1, wherein the second electrode has an inclined portion in the substrate direction.

4. The organic light emitting diode display of claim 3, wherein an inclined angle of the inclined portion is 30° to 75°.

5. The organic light emitting diode display of claim 1, wherein an inclined angle of the circular arc portion is 30° to 75° relative to a surface of the first electrode at a point corresponding to a contact point between the first electrode and the pixel defining layer.

6. The organic light emitting diode display of claim 1, wherein the insulating layer comprises a first insulating layer on the substrate and a second insulating layer on the first insulating layer, and wherein a concave portion is defined by the second insulating layer.

7. The organic light emitting diode display of claim 6, wherein the concave portion is formed at an external area of the first electrode.

8. An organic light emitting diode display, comprising:
a substrate;
a first electrode on the substrate;
an organic emission layer on the first electrode; and
a second electrode on the organic emission layer,
wherein both the first electrode and the second electrode are reflective electrodes, and the second electrode extends to an external area of the first electrode and has an inclination from the external area of the first electrode to the substrate direction, and
wherein the second electrode has a circular arc portion surrounding an end portion of the first electrode.

9. The organic light emitting diode display of claim 8, wherein an inclined angle of the inclination of the second electrode is 30° to 75°.

10. The organic light emitting diode display of claim 8, further comprising a pixel defining layer overlapped with the end portion of the first electrode to define a pixel of the display, wherein an inclined angle of the circular arc portion is 30° to 75° relative to a surface of the first electrode at a point corresponding to a contact point between the first electrode and the pixel defining layer.

11. The organic light emitting diode display of claim 8, further comprising a first insulating layer on the substrate and a second insulating layer on the first insulating layer, wherein a concave portion is defined by the second insulating layer.

12. The organic light emitting diode display of claim 11, wherein the concave portion is formed at an external area of the first electrode.

13. The organic light emitting diode display of claim 8, further comprising:
a semiconductor element on the substrate and electrically connected with the first electrode.

14. A manufacturing method of an organic light emitting diode display, the method comprising:
forming a first insulating layer on a substrate;
forming a second insulating layer on the first insulating layer;
forming a first electrode on the second insulating layer;
forming a pixel defining layer between the first electrodes of different pixels of the display;
forming an organic emission layer on the first electrode; and
forming a second electrode on the organic emission layer,
wherein the method further comprises forming a concave portion, by removing a part of the second insulating layer, in an area other than the area where the first electrode is disposed after forming the second insulating layer, the pixel defining layer is patterned throughout an end portion of the first electrode and the concave portion to be formed in an arch shape, the first electrode and the second electrode are reflective electrodes, and the second electrode is formed throughout the top of the organic emission layer and the top of the pixel defining layer, and
wherein the second electrode is formed to have a circular arc portion surrounding the end portion of the first electrode.

15. The manufacturing method of claim 14, wherein the second electrode is formed to have an inclined portion in the substrate direction.

16. The manufacturing method of claim 15, wherein an inclined angle of the inclined portion is 30° to 75°.

17. The manufacturing method of claim 14, wherein an inclined angle of the circular arc portion is 30° to 75° relative to a surface of the first electrode at a point corresponding to a contact point between the first electrode and the pixel defining layer.

* * * * *